US010410992B2

(12) United States Patent
Hagiwara et al.

(10) Patent No.: US 10,410,992 B2
(45) Date of Patent: Sep. 10, 2019

(54) BALL FORMING DEVICE, WIRE-BONDING APPARATUS, AND BALL FORMATION METHOD

(71) Applicant: SHINKAWA LTD., Tokyo (JP)

(72) Inventors: Yoshihito Hagiwara, Tokyo (JP); Kazumasa Sasakura, Tokyo (JP); Tatsuyuki Sunada, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 485 days.

(21) Appl. No.: 15/235,125

(22) Filed: Aug. 12, 2016

(65) Prior Publication Data
US 2016/0351538 A1 Dec. 1, 2016

Related U.S. Application Data

(63) Continuation of application No. PCT/JP2015/053661, filed on Feb. 10, 2015.

(30) Foreign Application Priority Data

Feb. 13, 2014 (JP) .................................. 2014-025487

(51) Int. Cl.
*H01L 23/00* (2006.01)
*B23K 20/00* (2006.01)
(Continued)

(52) U.S. Cl.
CPC ............ *H01L 24/85* (2013.01); *B23K 9/0026* (2013.01); *B23K 20/004* (2013.01); *H01L 24/73* (2013.01);
(Continued)

(58) Field of Classification Search
CPC ......... H01L 24/85; H01L 24/78; H01L 24/73; H01L 2224/45147; H01L 2224/45139; H01L 2224/45144; B23L 9/0026
(Continued)

(56) References Cited

U.S. PATENT DOCUMENTS 2,301,320 A * 11/1942 Phillips .............. B23K 35/0272
148/24
5,212,361 A 5/1993 Miyazaki et al.
(Continued)

FOREIGN PATENT DOCUMENTS

JP H02-181943 7/1990
JP H05-235078 9/1993
(Continued)

OTHER PUBLICATIONS

"Written Opinion of International Search Report (Form PCT/ISA/237)", dated Aug. 16, 2016, with English translation thereof, pp. 1-7.
(Continued)

*Primary Examiner* — Thien S Tran
(74) *Attorney, Agent, or Firm* — JCIPRNET

(57) ABSTRACT

A ball forming device 50 for forming a ball 43 at a tip of a wire 42 by producing discharge between a torch electrode 48 and the tip of the wire 42, the device includes: a current supply unit 54 configured to supply a ball-forming current between the torch electrode 48 and the tip of the wire 42; and a current control unit 57 configured to control the current supply unit 54, so that a signal of the ball-forming current for a predetermined period includes a first period in which the signal takes a predetermined current value and a second period including a triangle wave. With this, it is possible to provide a ball forming device, a wire-bonding apparatus, and a ball formation method that are capable of suppressing formation of deformed balls.

7 Claims, 7 Drawing Sheets

(51) Int. Cl.
*B23K 9/00* (2006.01)
*B23K 101/42* (2006.01)

(52) U.S. Cl.
CPC .......... *H01L 24/78* (2013.01); *B23K 2101/42* (2018.08); *H01L 24/45* (2013.01); *H01L 24/48* (2013.01); *H01L 2224/32225* (2013.01); *H01L 2224/45139* (2013.01); *H01L 2224/45144* (2013.01); *H01L 2224/45147* (2013.01); *H01L 2224/48091* (2013.01); *H01L 2224/48227* (2013.01); *H01L 2224/48465* (2013.01); *H01L 2224/73265* (2013.01); *H01L 2224/78271* (2013.01); *H01L 2224/78301* (2013.01); *H01L 2224/78347* (2013.01); *H01L 2224/78353* (2013.01); *H01L 2224/85045* (2013.01); *H01L 2224/85205* (2013.01)

(58) Field of Classification Search
USPC ............ 219/56.21, 56.22, 74, 130.5, 130.51, 219/137 PS, 146.41
See application file for complete search history.

(56) References Cited

U.S. PATENT DOCUMENTS

| | | | |
|---|---|---|---|
| 2010/0206849 A1* | 8/2010 | Takahashi | H01L 24/78 219/56 |
| 2012/0199560 A1* | 8/2012 | Era | B23K 9/0731 219/74 |
| 2015/0001198 A1* | 1/2015 | Colvin | B23K 35/302 219/146.41 |

FOREIGN PATENT DOCUMENTS

| | | |
|---|---|---|
| JP | H06-101491 | 12/1994 |
| JP | 2006-041412 | 2/2006 |
| JP | 2012110915 | 6/2012 |

OTHER PUBLICATIONS

"Office Action of China Counterpart Application," dated May 2, 2018, with English translation thereof, pp. 1-14.

\* cited by examiner

BALL FORMING DEVICE, WIRE-BONDING APPARATUS, AND BALL FORMATION METHOD

CROSS REFERENCE TO RELATED APPLICATIONS

This application is a Continuation of PCT International Application No. PCT/JP2015/053661, filed on Feb. 10, 2015, which claims priority under 35 U.S.C § 119(a) to Patent Application No. 2014-025487, filed in Japan on Feb. 13, 2014, all of which are hereby expressly incorporated by reference into the present application.

TECHNICAL FIELD

Aspects of the present invention relates to a ball forming device, a wire-bonding apparatus, and a ball formation method.

BACKGROUND ART

In a method of fabricating semiconductor devices, wire bonding in which an electrode of a semiconductor device and a line of a substrate are electrically connected via a wire has been widely used, for example. Typical examples of wire bonding include a so-called ball bonding method. Specifically, discharge is produced between an electrode and a tip of a wire inserted through a bonding tool (e.g., capillary) to form a ball at the tip of the wire. Then, the bonding tool is moved downward toward an electrode of a semiconductor device, and the ball of the wire is bonded onto the electrode of the semiconductor device after applying a load and ultrasonic vibration to the ball.

As a wire-bonding apparatus employing the ball bonding method, there is known an apparatus in which a discharge condition is controlled in order to form uniform balls at as tip of a wire by comparing a value equivalent to Joule heat during ball formation based on a discharge voltage and a discharge current generated between an electrode and a tip of a wire with a set value of a heat amount that has been previously set (cf. PTL 1, for example).

CITATION LIST

Patent Literature

PTL 1: Japanese Unexamined Patent Application Publication No. H02-181943

Incidentally, according to the conventional wire-bonding apparatus, a ball having a predetermined diameter (diameter) is formed at a tip of a wire while a constant current control is performed such that a current between an electrode and the tip of the wire takes a constant current value.

However, as in a ball formation method using the conventional wire-bonding apparatus, depending on materials of the wire, supplying a current of a constant current value between the electrode and the tip of the wire often results in formation of deformed balls including deformation such as bubbles, shrinkage cavities, and eccentricity.

SUMMARY OF INVENTION

Technical Problem

Aspects of the present invention have been made in view of the above problems, and that the present invention is to provide a ball forming device, a wire-bonding apparatus, and a ball formation method that are capable of suppressing formation of deformed balls.

Solution to Problem

A ball forming device according to one aspect of the present invention is a ball forming device for forming a ball at a tip of a wire by producing discharge between an electrode and the tip of the wire, the device including: a current supply unit configured to supply a ball-forming current between the electrode and the tip of the wire; and a current control unit configured to control the current supply unit, so that a signal of the ball-forming current for a predetermined period includes a first period in which the signal takes a predetermined current value and a second period including a triangle wave.

According to the ball forming device, the second period can include a triangle wave having predetermined amplitude.

According to the ball forming device, the second period can include a triangle wave whose current value gradually decreases over time.

According to the ball forming device, the wire can be constituted from a material of a plurality of metals.

A wire-bonding apparatus according to one aspect of the present invention includes the ball forming device described above.

A ball formation method according to one aspect of the present invention is a ball formation method of forming a ball at a tip of a wire by producing discharge between an electrode and the tip of the wire, the method including: a current supply step of supplying a ball-forming current between the electrode and the tip of the wire, wherein a signal of the ball-forming current for a predetermined period includes a first period in which the signal takes a predetermined current value and a second period including a triangle wave.

Advantageous Effect of Invention

According to the present invention, the signal of the ball-forming current for the predetermined period includes the first period in which the current takes the predetermined current value. With this, the predetermined current value is supplied between the electrode and the tip of the wire for the first period, and therefore it is possible to suppress variation in the diameter (diameter) of the ball, and to form a ball of a predetermined diameter (diameter) at the tip of the wire. Further, the signal of the ball-forming current for the predetermined period further includes the second period containing a triangle wave. With this, melting (fusion) and solidification are repeatedly performed over a surface of the ball formed during the first period due to the ball-forming current of the triangle wave, and thus surface tension is produced for a plurality of times. Therefore, it is possible to flatten irregularity and deformation of the surface. Therefore, it is possible to stably form the ball with a predetermined diameter (diameter), and to suppress formation of a deformed ball such as a bubble, a shrinkage cavity, and eccentricity.

DESCRIPTION OF EMBODIMENTS

Figure 1:
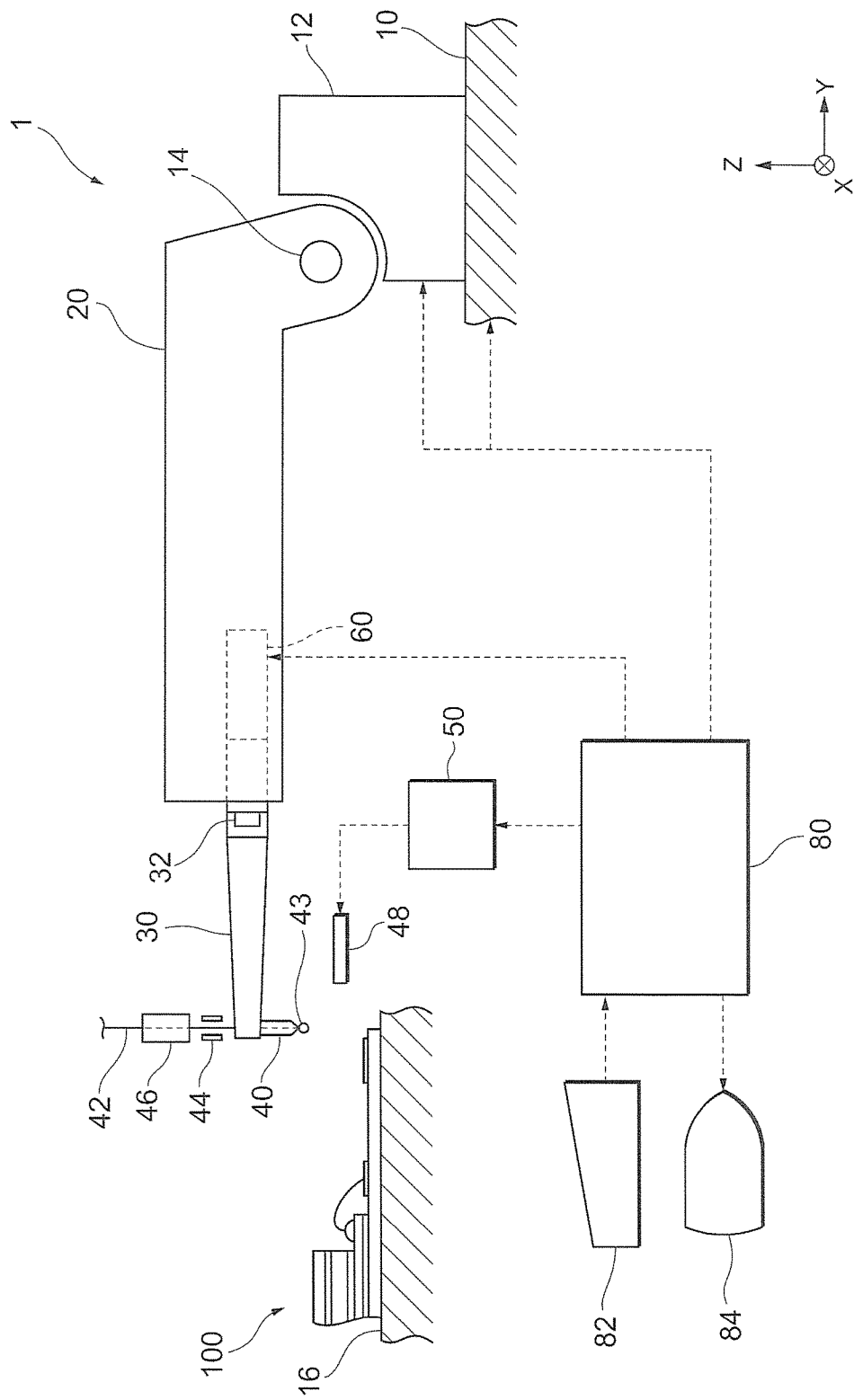
FIG. 1 is a schematic configurational diagram for illustrating one example of a wire-bonding apparatus according to this embodiment.

Hereinafter, an embodiment of the present invention will be described. In the appended drawings, like or identical components are denoted by like or identical reference numerals. It should be noted that the drawings are schematic drawings. Therefore, specific dimensions and the like should be determined based on the following description. It should also be understood that ratios and proportions of dimensions can be different between the drawings. In addition, the technical scope of the present invention should not be considered to be restricted to this embodiment. Note, in the following description, that an upper side, a lower side, a left side, and a right side in the drawings are respectively referred to as "top or above", "bottom or under", "left", and "right".

FIG. 1 through FIG. 7 are provided for illustrating one embodiment of a ball forming device, a wire-bonding apparatus, and a ball formation method according to the present invention. FIG. 1 is a schematic configurational diagram for illustrating one example of the wire-bonding apparatus according to this embodiment. A wire-bonding apparatus 1 according to this embodiment is an apparatus used for performing wire bonding. The wire-bonding apparatus 1 includes a ball forming device 50 according to this embodiment.

Referring to FIG. 1, the wire-bonding apparatus 1 includes an XY driving mechanism 10, a bonding arm 20, an ultrasonic horn 30, a bonding tool 40, the ball forming device 50, an ultrasonic vibrator 60, and a controller 80.

The XY driving mechanism 10 is configured movably in an XY axis direction (planar direction), and the XY driving mechanism (linear motor) 10 is provided with a Z driving mechanism (linear motor) 12 capable of moving the bonding arm 20 in a Z axis direction (up-down direction).

The bonding arm 20 is supported by a shaft pivot 14, and configured swingably with respect to the XY driving mechanism 10. The bonding arm 20 is provided in a substantial cuboid so as to extend from the XY driving mechanism 10, and configured to, during wire bonding, move to a position at a predetermined distance from a bonding stage 16 on which a semiconductor device 100 as a bonding target is placed.

The ultrasonic horn 30 is attached to an end of the bonding arm 20 using a horn fixation thread 32. The ultrasonic horn 30 has the bonding tool 40 at its end. The ultrasonic vibrator 60 produces ultrasonic vibration, which is transmitted to the bonding tool 40 via the ultrasonic horn 30, and thus ultrasonic vibration can be applied to a bonding target via the bonding tool 40. Examples of the ultrasonic vibrator 60 include a piezoelectric vibrator.

The bonding tool 40 is a tool through which a wire 42 is inserted. One example of the bonding tool 40 is a capillary having an insertion hole. In this case, the bonding tool 40 is configured such that the wire 42 used for bonding is inserted through the insertion hole of the bonding tool 40, so that a part of the wire 42 can be fed from an end of the bonding tool 40. The bonding tool 40 is attached to the ultrasonic horn 30 in a replaceable manner by strength of a spring or the like. Further, a wire clamper 44 is provided above the bonding tool 40. The wire clamper 44 is configured to hold and release the wire 42 at predetermined timing. Further above the wire clamper 44, a wire tensioner 46 is provided. The wire tensioner 46 is configured to insert the wire 42 and apply an appropriate degree of tension to the wire 42 during bonding.

A material of the wire 42 can be selected as needed based on conditions such as workability and low electrical resistance, and examples of such a material to be used include gold (Au), copper (Cu), and silver (Ag). It should be noted that the material of the wire 42 is not limited to a single metal, and a material containing a plurality of metals such as copper-palladium (Cu—Pd) can be used.

A torch electrode 48 is an electrode for producing a discharge (spark). The torch electrode 48 is configured to be able to form a ball 43 at a tip of the wire 42 (one end) feed from the end of the bonding tool 40 using heat of discharge. Further, a position of the torch electrode 48 is fixed. During discharge, the bonding tool 40 moves to a position at a predetermined distance from the torch electrode 48 to produce an appropriate degree of discharge between the torch electrode 48 and the tip (one end) of the wire 42.

The ball forming device 50 is a device that is used in the ball formation method according to this embodiment. Further, the ball forming device 50 and the controller 80 are configured such that signal transmission therebetween is possible so that one of them is able to actuate or stop a function of the other.

The controller 80 is connected to the XY driving mechanism 10, the Z driving mechanism 12, the ultrasonic horn 30 (the ultrasonic vibrator 60), and the ball forming device 50. By having the controller 80 control these components, it is possible to perform a process required for wire bonding. The controller 80 includes interfaces (not shown) for signal transmission with the components described above such as the XY driving mechanism 10, the Z driving mechanism 12, the ultrasonic horn 30 (the ultrasonic vibrator 60), and the ball forming device 50.

Further, to the controller 80, an operation unit 82 for inputting control information and a display unit 84 for outputting control information are connected. Using these components, an operator is able to input necessary control information through the operation unit 82 while confirming a screen using the display unit 84. The controller 80 can be configured as a computer including components such as a CPU and a memory, in which a program and data required for wire bonding are recorded in advance.

Figure 2:
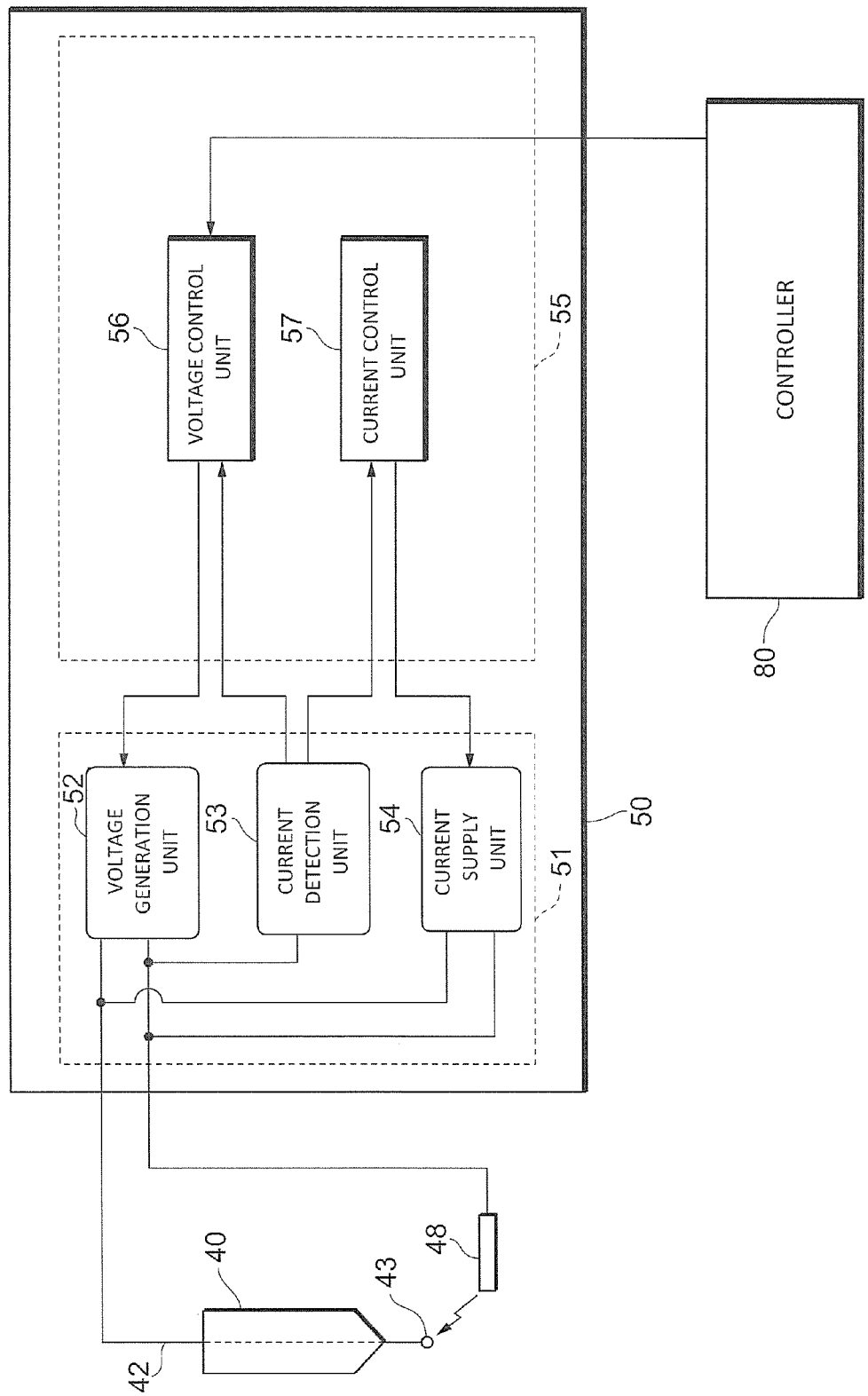
FIG. 2 is a schematic configurational diagram for illustrating one example of a ball forming device according to this embodiment.

FIG. 2 is a schematic configurational diagram for illustrating one example of the ball forming device according to this embodiment. The ball forming device 50 is a device for forming the ball 43 at the tip of the wire 42. As illustrated in FIG. 2, the ball forming device 50 includes a source circuit 51 and a control circuit 55.

The source circuit 51 is a circuit for producing discharge, as well as for detecting an electrical signal related to discharge. The source circuit 51 is, for example, a linear-type source circuit that generates a voltage and a current that are stable and with less fluctuation. The source circuit 51 includes a voltage generation unit 52, a current detection unit 53, and a current supply unit 54.

The voltage generation unit 52 is a unit for generating a voltage. The voltage generation unit 52 is connected to the control circuit 55, and generates a predetermined high voltage, e.g., a high voltage up to about 5000 [V], based on a control signal from the control circuit 55. Further, the voltage generation unit 52 is also connected to the torch electrode 48, and to the other end of the wire 42 that is on the other side of the tip (one end) of the wire 42 fed from the bonding tool 40. The voltage generation unit 52 is configured to apply the generated predetermined high voltage between the torch electrode 48 and the tip of the wire 42. With this, discharge is produced between the torch electrode 48 and the tip of the wire 42.

The voltage generation unit 52 can be configured to include a constant-voltage circuit and a booster transformer (transformer), for example. In this case, the voltage generation unit 52 generates a constant high voltage value based on feedback control in which a part of a voltage output from the constant-voltage circuit and boosted by the booster transformer is again fed back to the constant-voltage circuit. As the booster transformer, a linear-output transformer having both a constant voltage function and a constant current function is used, for example.

The current detection unit 53 is a unit for detecting a current, and connected to the torch electrode 48. The current detection unit 53 is also connected to the control circuit 55, and configured to output a detection signal of a discharge current to the control circuit 55 upon flowing of the discharge current between the torch electrode 48 and the wire 42 due to discharge.

The current detection unit 53 can be configured to include a resistor for detecting a discharge current, a power source as a threshold, and a comparator, for example. In this case, the current detection unit 53 outputs a detection signal of a discharge current when a voltage value of the discharge current is higher than a voltage value of the power source.

The current supply unit 54 is a unit for supplying a current, and connected to the torch electrode 48 and the other end of the wire 42. The current supply unit 54 is also connected to the control circuit 55, and is configured to supply a ball-forming current, which is a current for forming the ball 43, between the torch electrode 48 and the tip of the wire 42 based on the control signal from the control circuit 55.

The current supply unit 54 can be configured to include a constant-current circuit and a booster transformer (transformer), for example. In this case, the current supply unit 54 supplies a current of a constant current value output from the constant-current circuit and boosted by the booster transformer. As the booster transformer, a linear-output transformer having both a constant voltage function and a constant current function is used, for example, and can be shared with the voltage generation unit 52.

The control circuit 55 is a circuit for controlling discharge. The control circuit 55 includes interfaces (not shown) for signal transmission with the components of the source circuit 51 described above such as the voltage generation unit 52, the current detection unit 53, and the current supply unit 54. The control circuit 55 also includes a voltage control unit 56 and a current control unit 57. The control circuit 55 is configured to allow signal transmission between the voltage control unit 56 and the current control unit 57.

The voltage control unit 56 is a unit for controlling the voltage generation unit 52 for generating a voltage. The voltage control unit 56 is configured to be able to control a voltage generated by the voltage generation unit 52, such as start (on), end (off), and a value of the voltage, as well as a time (period) during which the voltage value is applied.

For example, the voltage control unit 56 outputs, to the voltage generation unit 52, a voltage-application-start control signal for starting application of a predetermined high voltage (on signal) based on a control signal from the controller 80. Further, for example, the voltage control unit 56 outputs, to the voltage generation unit 52, a voltage-application-end control signal for stopping application of the predetermined high voltage (off signal) based on a detection signal of the discharge current from the current detection unit 53.

The current control unit 57 is a unit for controlling the current supply unit 54 for supplying a current. The current control unit 57 is configured to be able to control a ball-forming current supplied by the current supply unit 54, such as start (on), end (off), and a value of the current, and time (period) for supply the current value.

For example, the current control unit 57 outputs a control signal to the current supply unit 54, so as to supply a ball-forming current between the torch electrode 48 and the tip of the wire 42 for a predetermined period, based on a detection signal of the discharge current from the current detection unit 53.

Further, the current control unit 57 can be configured to include a pulse generator, for example. In this case, the current control unit 57 outputs a pulse signal as the control signal to the current supply unit 54. The current control unit 57 is able to set an output value (amplitude), time (width), and a cycle of the pulse signal to predetermined values. The output value (amplitude), the time (width), and the cycle of the pulse signal are set, for example, based on of a diameter of the wire 42, a material of the wire 42 (material), a diameter of the ball 43 (diameter) to be formed, and the like.

In this embodiment, the example in which a detection signal of the discharge current from the current detection unit 53 is input to the voltage control unit 56 and the current control unit 57 is described, but the present invention is not limited to such an example. For example, it is possible to employ a configuration in which a detection signal of the discharge current from the current detection unit 53 is input only to the voltage control unit 56, and the voltage control unit 56 then transmits the input detection signal of the discharge current to the current control unit 57. Further, the ball forming device 50 can include a unillustrated switching circuit (switch circuit) configured to switch connection between the voltage control unit 56 and the current control unit 57 and each of the components of the source circuit 51 described above, based on the detection signal of the discharge current from the current detection unit 53. In this case, before the detection signal of the discharge current is input, the switching circuit (switch circuit) electrically connects between the voltage generation unit 52 and the voltage control unit 56, but electrically disconnects the current supply unit 54 from the current control unit 57. Then, upon input of the detection signal of the discharge current, the switching circuit (switch circuit) electrically disconnects the voltage generation unit 52 from the voltage control unit 56, but electrically connects between the current supply unit 54 and the current control unit 57.

Next, the method of forming a ball at the tip of the wire will be described with reference to FIG. 3 through FIG. 7.

Figure 3:
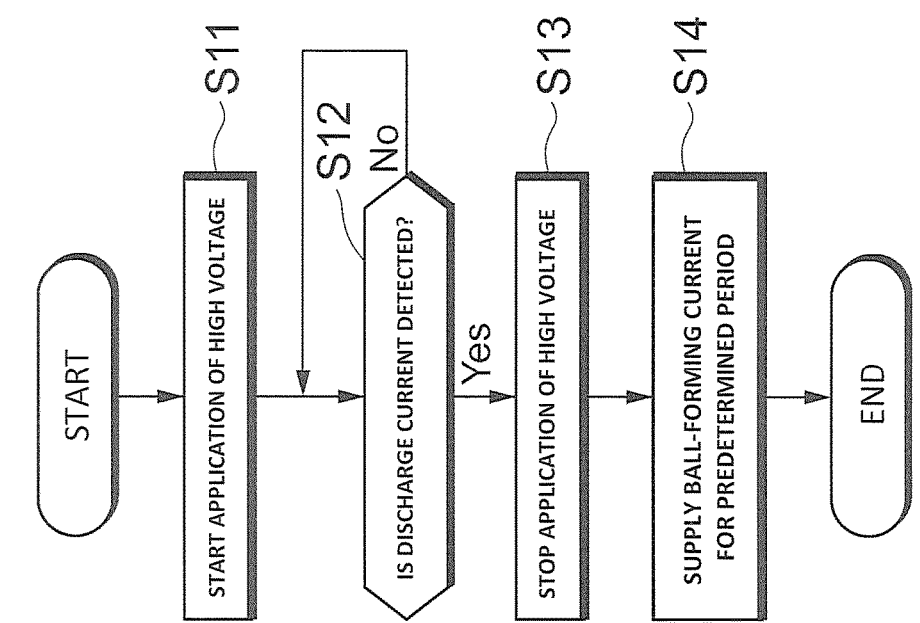
FIG. 3 is a flowchart showing one example of a ball formation method according to this embodiment.

FIG. 3 is a flowchart showing one example of the ball formation method according to this embodiment. Referring to FIG. 3, upon starting of a ball formation process S10, first, the voltage control unit 56 outputs a voltage-application-start control signal (on signal) to the voltage generation unit 52, and the voltage generation unit 52 starts application of a predetermined high voltage between the torch electrode 48 and the tip of the wire 42 (S11).

Next, the voltage control unit 56 determines whether or not a discharge current is detected based on the detection signal of the discharge current input from the current detection unit 53 (S12), and repeats the step in S12 until a discharge current is detected.

If a discharge current is detected as a result of determination in S12, the voltage control unit 56 outputs a voltage-application-end control signal (off signal) to the voltage generation unit 52, and the voltage generation unit 52 then stops application of a predetermined high voltage between the torch electrode 48 and the tip of the wire 42 (S13). In addition, the current control unit 57 outputs a control signal to the current supply unit 54, and the current supply unit 54 then supplies a ball-forming current between the torch electrode 48 and the tip of the wire 42 for a predetermined period (S14).

After the step in S14, the current control unit 57 ends the ball formation process S10.

Now, a conventional ball formation method will be described for comparison.

Figure 4:
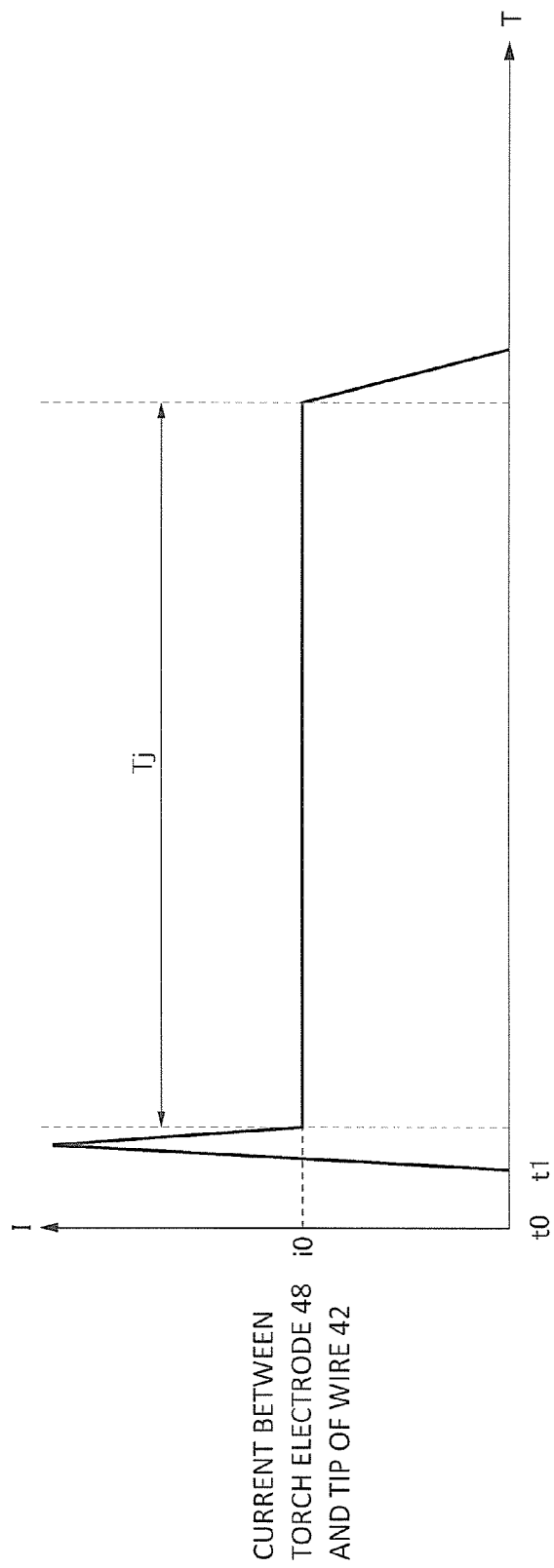
FIG. 4 is a graph of a current signal for the conventional ball formation method.
Figure 5:
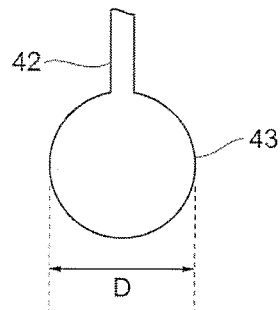
FIG. 5(A) through FIG. 5(D) are diagrams illustrating a ball formed at a tip of a wire.
Figure 5:
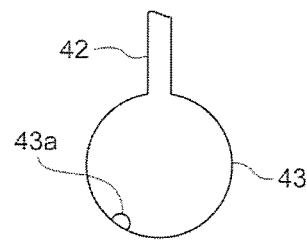
Figure 5:
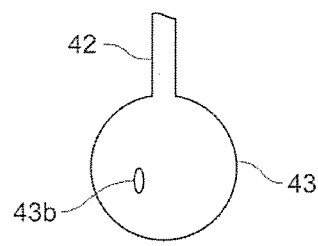
Figure 5:
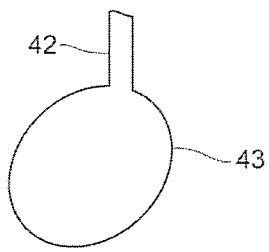

FIG. 4 is a graph of a current signal for the conventional ball formation method. As shown in FIG. 4, according to the conventional ball formation method, at time t1, after discharge is produced between the torch electrode 48 and the tip of the wire 42, a current of a constant current value i0 is supplied between the torch electrode 48 and the tip of the wire 42 for a predetermined period Tj.

FIG. 5(A) through FIG. 5(D) show diagrams illustrating a ball formed at the tip of the wire; FIG. 5(A) is a diagram illustrating one example of a normal ball, FIG. 5(B) is a diagram illustrating one example of a deformed ball, FIG. 5(C) is a diagram illustrating another example of a deformed ball, and FIG. 5(D) is a diagram illustrating yet another example of a deformed ball. By supplying a current between the torch electrode 48 and the tip of the wire 42 after production of discharge, the ball 43 having a predetermined diameter (diameter) D, for example, is formed at the tip of the wire 42, as shown in FIG. 5(A). The ball 43 is in a spherical shape or a substantial spherical shape, and considered to be a normal ball (normal ball).

In contrast, in the conventional ball formation method shown in FIG. 4, if the material of the wire 42 is copper (Cu) or the like, for example, a bubble 43a can often be produced on a surface of the ball 43 due to discharge as shown in FIG. 5(B). Further, in the conventional ball formation method shown in FIG. 4, if the material of wire 42 is copper-palladium (Cu—Pd) or the like, for example, and if the surface of the ball 43 has a portion at which concentration of palladium (Pd) is high, a shrinkage cavity 43b can often be formed at this portion as shown in FIG. 5(C). Similarly, in the conventional ball formation method shown in FIG. 4, if the material of wire 42 is copper-palladium (Cu—Pd) or the like, for example, a gravity center of the ball 43 can possibly displace from its center of rigidity and thus eccentricity occurs as shown in FIG. 5(D). In the cases of FIG. 5(B) and FIG. 5(D), while it is possible to form the ball 43 with a predetermined diameter (diameter), the shape of the ball is deformed from a spherical shape or a substantial spherical shape, and therefore the ball 43 is considered to be a ball having a deformed shape (deformed ball).

Figure 6:
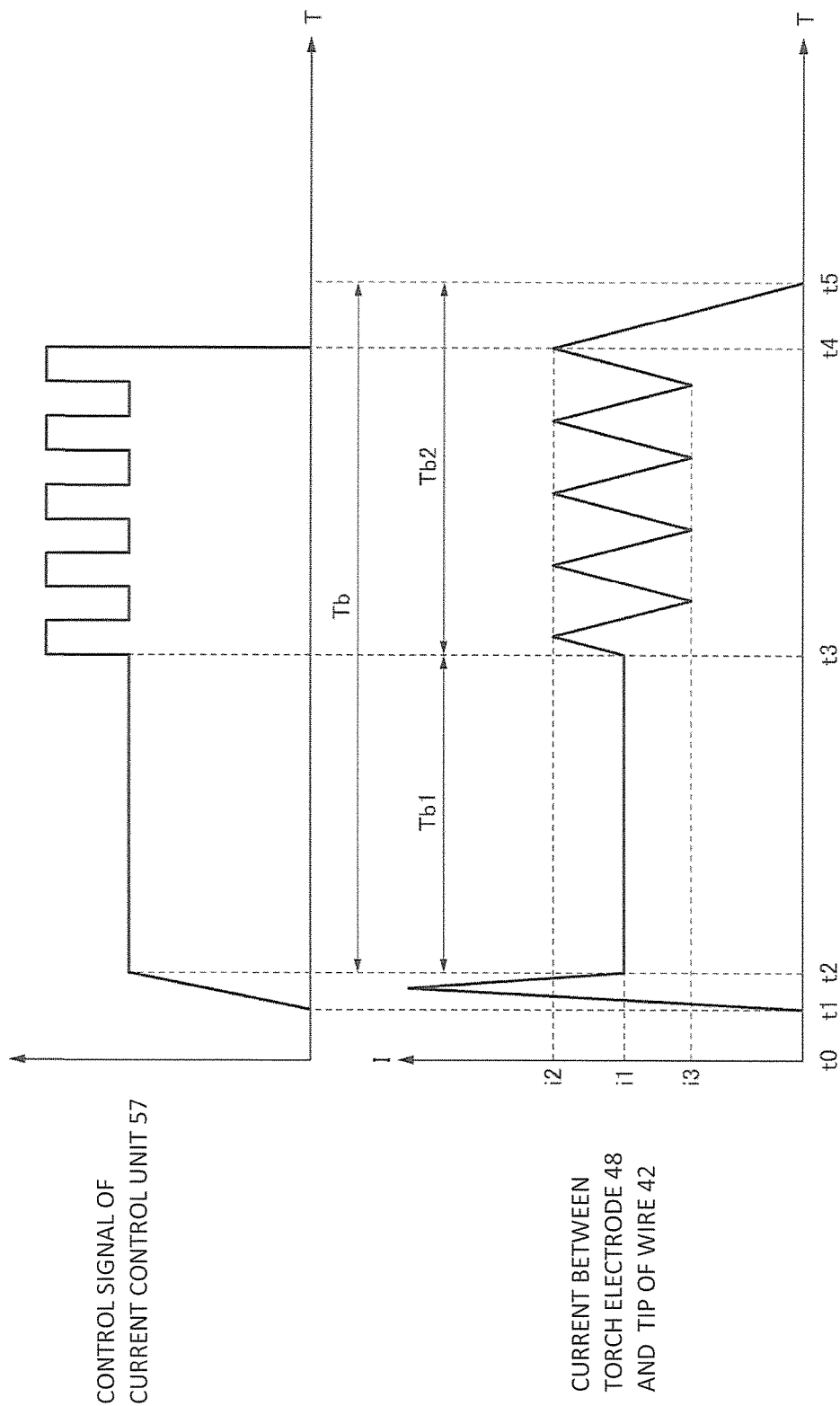
FIG. 6 is a time chart of one example of the ball formation method according to this embodiment.

FIG. 6 is a time chart of one example of the ball formation method according to this embodiment. In practice, it is possible that there is a time lag (time lag) in the ball-forming current supplied by the current supply unit 54 with respect to a signal output from the current control unit 57. However, for simplicity of illustration, FIG. 6 assumes that there is no time lag (time lag) unless clearly observed. This also applies to the following description. In the ball formation method according to this embodiment, as shown in FIG. 6, at time t0, the voltage control unit 56 outputs a voltage-application-start control signal (on signal) to the voltage generation unit 52, and the voltage generation unit 52 then starts application of a predetermined high voltage between the torch electrode 48 and the tip of the wire 42. Then, after a predetermined time elapses, at time t1, discharge is produced and a discharge current flows between the torch electrode 48 and the tip of the wire 42. At this time, if the current detection unit 53 detects the discharge current and outputs the detection signal of the discharge current, the current control unit 57 outputs a control signal to control the current supply unit 54, and the current supply unit 54 supplies a ball-forming current between the torch electrode 48 and the tip of the wire 42 for a predetermined period Tb.

More specifically, the current control unit 57 outputs a pulse signal of a predetermined output value (predetermined amplitude) to the current supply unit 54 for time (period) from time t2 to time t3. The current supply unit 54 supplies, based on this pulse signal, a ball-forming current of a predetermined current value i1 between the torch electrode 48 and the tip of the wire 42 for time (period) from time t2 to time t3. Here, one example of the predetermined current value i1 is about 40 [mA].

Next, at time t3, the current control unit 57 outputs a pulse signal of a predetermined output value (predetermined amplitude) and a predetermined time period (predetermined width) to the current supply unit 54. This pulse signal is output for a plurality of times (a plurality of pulses are output) for time (period) from time t3 to time t4. Based on the pulse signals of the plurality of times (the plurality of pulses), the current supply unit 54 supplies a ball-forming current between the torch electrode 48 and the tip of the wire 42. The ball-forming current has a triangle waveform (waveform of a triangle wave) in which a current value rises (increases) and drops (decreases) repeatedly. The triangle wave has predetermined amplitude with a maximum current value i2 and a minimum current value i3, for example. Here, one example of the maximum current value i2 is about 50 [mA], and one example of the minimum current value i3 is about 30 [mA].

It should be noted that, the term "triangle wave" in the present application refers to a waveform having triangle or a triangular shape, and includes a nearly triangle wave, an approximate triangle wave, and a substantial triangle wave, as well as a saw-tooth wave (sawtooth wave). Therefore, it is obvious that the term "triangle wave" in the present application is not limited to a triangle wave in a strict sense (narrow sense).

Next, at time t4, the current control unit 57 stops (ends) outputting the pulse signal, and the current supply unit 54 supplies a ball-forming current between the torch electrode 48 and the tip (one end) of the wire 42 while the current value decreases from time t4 to time t5. Then, at time t5, the current supply unit 54 stops (ends) supply of the ball-forming current between the torch electrode 48 and the tip of the wire 42, and thus the ball 43 is formed at the tip of the wire 42. Here, one example of the time (period) from time t0 to time t5 is about 100 μsec.

Here, as shown in FIG. 6, the signal of the ball-forming current for time (period) from time t2 to time t5, that is, the predetermined period Tb, includes time (period) from time t2 to time t3, that is, a first period Tb1, in which the current takes the predetermined current value i1. With this, the predetermined current value i1 is supplied between the torch electrode 48 and the tip of the wire 42 for the first period Tb1, and therefore it is possible to suppress variation in the diameter (diameter) of the ball, and to form a ball of a predetermined diameter (diameter) at the tip (one end) of the wire 42.

Further, as shown in FIG. 6, the signal of the ball-forming current for the predetermined period Tb further includes time (period) from time t3 to time t5, that is, a second period Tb2, containing a triangle wave. With this, melting (fusion) and solidification are repeatedly performed over a surface of the ball formed during the first period Tb1 due to the ball-forming current of the triangle wave, and thus surface tension is produced for a plurality of times. Therefore, it is possible to flatten irregularity and deformation of the surface.

It should be noted that, the wire 42 is preferably constituted from a material of a plurality of metals, such as copper-palladium (Cu—Pd). In this case, even if the surface of the ball formed during the first period Tb1 has a portion at which concentration of palladium (Pd) is high, palladium Pd) is diffused into copper (Cu) when the surface of the ball is melted (fused) by the ball-forming current of a triangle wave in the second period Tb2. Therefore, it is possible to uniformize concentration of palladium (Pd) over the surface of the ball, and to effectively suppress formation of the shrinkage cavity 43b shown in FIG. 5(C).

Figure 7:
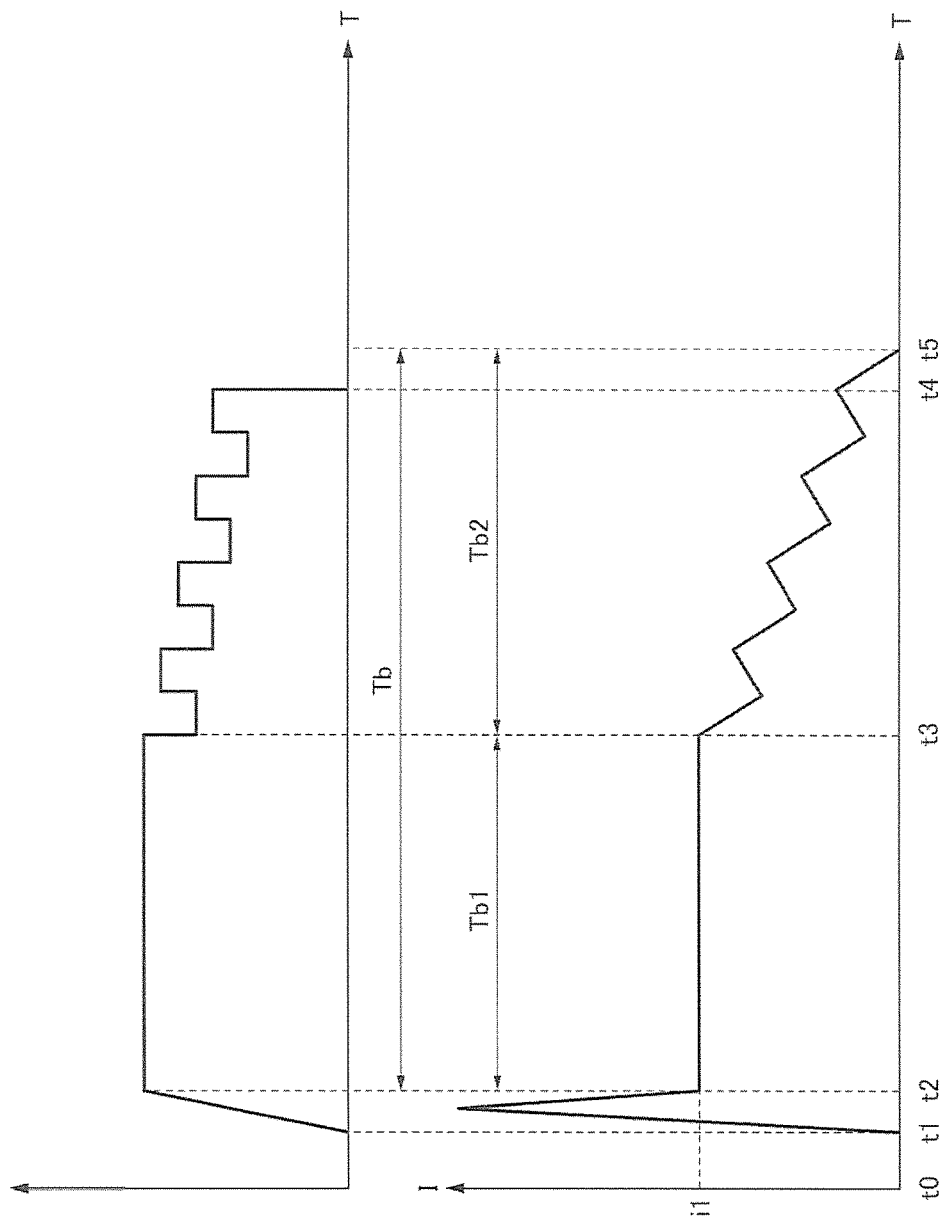
FIG. 7 is a time chart of another example of the ball formation method according to this embodiment.

FIG. 7 is a time chart of another example of the ball formation method according to this embodiment. Similarly to the example shown in FIG. 6, unless clearly observed, FIG. 7 assumes that there is no time lag (time lag) in the ball-forming current supplied by the current supply unit 54 with respect to a signal output from the current control unit 57. This also applies to the following description. Further, the time (period) from time t0 to time t3 including the first period Tb1 is the same as in FIG. 6, and therefore description of this period shall be omitted. As shown in FIG. 7, at time t3, the current control unit 57 outputs a pulse signal of a predetermined time period (predetermined width) to the current supply unit 54. This pulse signal is output for a plurality of times (a plurality of pulses are output) for time (period) from time t3 to time t4. The plurality of pulses have different output values (amplitude), respectively, and these output values (amplitude) decrease over time. Based on the pulse signals of the plurality of times (the plurality of pulses), the current supply unit 54 supplies a ball-forming current between the torch electrode 48 and the tip of the wire 42. The ball-forming current has a triangle waveform (waveform of a triangle wave) in which a current value rises (increases) and drops (decreases) repeatedly. The current value of this triangle wave gradually decreases over time.

At time t4, the current control unit 57 stops (ends) outputting the pulse signal, and the current supply unit 54 supplies a ball-forming current between the torch electrode 48 and the tip (one end) of the wire 42 while the current value decreases from time t4 to time t5. Then, at time t5, the current supply unit 54 stops (ends) supply of the ball-forming current between the torch electrode 48 and the tip of the wire 42, and thus the ball 43 is formed at the tip of the wire 42.

Here, as shown in FIG. 7, the signal of the ball-forming current for the predetermined period Tb includes time (period) from time t3 to time t5 containing a triangle wave, that is, the second period Tb2, and the current value of this triangle wave decreases over time. With this, melting (fusion) and solidification are repeatedly performed over a surface of the ball formed during the first period Tb1 due to the ball-forming current of the triangle wave, and thus surface tension is produced for a plurality of times. Therefore, it is possible to flatten irregularity and deformation of the surface. In addition, the ball liquefied in the first period Tb1 is gradually cooled as the current value of this triangle wave decreases over time, and therefore it is possible to form the ball 43 having a shape of a true sphere or a substantial true sphere.

This embodiment describes the example in which the second period Tb2 shown in FIG. 6 includes a triangle wave with the predetermined maximum current value i2 and the predetermined minimum current value i3, and the example in which the second period Tb2 shown in FIG. 7 includes a triangle wave whose current value decreases over time. However, the present invention is not limited to these examples. For example, the second period Tb2 can include both a triangle wave with the predetermined maximum current value and the predetermined minimum current value, and a triangle wave whose current value decreases over time.

As described above, according to this embodiment, the signal of the ball-forming current for the predetermined period Tb includes the first period Tb1 in which a current takes the predetermined current value i1 as shown in FIG. 6 and FIG. 7. With this, the predetermined current value i1 is supplied between the torch electrode 48 and the tip of the wire 42 for the first period Tb1, and therefore it is possible to suppress variation in the diameter (diameter) of the ball, and to form a ball of a predetermined diameter (diameter) at the tip (one end) of the wire 42. Further, as shown in FIG. 6 and FIG. 7, the signal of the ball-forming current for the predetermined period Tb further includes the second period Tb2 containing a triangle wave. With this, melting (fusion) and solidification are repeatedly performed over a surface of the ball formed during the first period Tb1 due to the ball-forming current of the triangle wave, and thus surface tension is produced for a plurality of times. Therefore, it is possible to flatten irregularity and deformation of the surface. Therefore, as shown in FIG. 5(A), it is possible to stably form the ball 43 with a predetermined diameter (diameter) D, and to suppress formation of a deformed ball such as the bubble 43a, the shrinkage cavity 43b, and eccentricity as shown in FIG. 5(B) through FIG. 5(D).

It should be noted that the present invention is not limited to the above embodiment, and can be applied with modification in various manners.

Further, the examples and the applications described by way of the above embodiment of the present invention can be combined, modified, or improved for many purposes as needed, and the present invention is not limited to the above embodiment. It should be appreciated from the appended claims that aspects with such a combination, modification, and improvement can also be included in the technical scope of the present invention.

The invention claimed is:

1. A ball forming device for forming a ball at a tip of a wire by producing discharge between an electrode and the tip of the wire, the device comprising:
   a current supply unit configured to supply a ball-forming current between the electrode and the tip of the wire;
   a discharge detection unit configured to detect a discharge between the electrode and the tip of the wire; and
   a current control unit, which controls the ball-forming current to a predetermined value to form the ball with a predetermined diameter at the tip of the wire after the discharge is detected, and controls to produce a plurality of triangle waves in the ball-forming current to flatten a surface of the ball after the ball with the predetermined diameter is formed.

2. The ball forming device according to claim 1, wherein the second period includes a triangle wave having predetermined amplitude.

3. The ball forming device according to claim 1, wherein the second period includes a triangle wave whose current value gradually decreases over time.

4. The ball forming device according to claim 2, wherein the second period includes a triangle wave whose current value gradually decreases over time.

5. The ball forming device according to claim 1, wherein the wire is constituted from a material of a plurality of metals.

6. A wire-bonding apparatus comprising:
the ball forming device according to claim 1.

7. A ball formation method of forming a ball at a tip of a wire by producing discharge between an electrode and the tip of the wire, the method comprising:
   a current supply step of supplying a ball-forming current between the electrode and the tip of the wire,
   a discharge detection step of detecting a discharge between the electrode and the tip of the wire,
   a step of controlling the ball-forming current to a predetermined value to form the ball with a predetermined diameter at the tip of the wire after the discharge is detected, and
   a step of producing a plurality of triangle waves in the ball-forming current to flatten a surface of the ball after the ball with the predetermined diameter is formed.

* * * * *